(12) United States Patent
Chang

(10) Patent No.: US 7,633,343 B2
(45) Date of Patent: Dec. 15, 2009

(54) FULLY DIFFERENTIAL AMPLIFIER

(75) Inventor: Wien-Hua Chang, Tainan County (TW)

(73) Assignee: Realtek Semiconductor Corp., Hsinchu (TW)

( * ) Notice: Subject to any disclaimer, the term of this patent is extended or adjusted under 35 U.S.C. 154(b) by 22 days.

(21) Appl. No.: 12/121,118

(22) Filed: May 15, 2008

(65) Prior Publication Data

US 2008/0284513 A1    Nov. 20, 2008

(30) Foreign Application Priority Data

May 17, 2007    (TW) ............................... 96117604 A

(51) Int. Cl.
*H03F 3/45* (2006.01)
(52) U.S. Cl. ...................... 330/258; 330/259
(58) Field of Classification Search .......... 330/258–260
See application file for complete search history.

(56) References Cited

U.S. PATENT DOCUMENTS

| | | | |
|---|---|---|---|
| 6,388,522 B1 * | 5/2002 | Fattaruso et al. ............ | 330/258 |
| 7,053,711 B2 * | 5/2006 | Bogner ........................ | 330/258 |
| 7,129,782 B2 * | 10/2006 | Lebedev et al. ............. | 330/258 |
| 7,453,319 B2 * | 11/2008 | Gupta et al. ................ | 330/258 |

* cited by examiner

*Primary Examiner*—Khanh V Nguyen

(57) ABSTRACT

A fully differential amplifier includes: an N-stage amplifier including first to Nth amplifier stages, where N is a positive integer greater than or equal to 2, the first to Nth amplifier stages being cascaded in sequence so as to generate a pair of differential output voltages; a common mode feedback circuit coupled to the N-stage amplifier, detecting a common mode level of the differential output voltages, and controlling the first amplifier stage according to the common mode level detected thereby; and a common mode frequency compensation circuit including a pair of capacitors, each having a first terminal coupled to the N-stage amplifier to receive a respective one of the differential output voltages, and a second terminal coupled to a common mode node of the first to (N-1)th amplifier stages of the N-stage amplifier.

13 Claims, 5 Drawing Sheets

US 7,633,343 B2

FULLY DIFFERENTIAL AMPLIFIER

CROSS-REFERENCE TO RELATED APPLICATION

This application claims priority of Taiwanese Application No. 096117604, filed on May 17, 2006.

BACKGROUND OF THE INVENTION

1. Field of the Invention

The present invention relates to an amplifier, more particularly to a fully differential amplifier.

2. Description of the Related Art

A fully differential amplifier has an enhanced immunity to external noise, and therefore, is often used in modern analog integrated circuits. Since the common mode loop gain of fully differential amplifiers is typically insufficient, drifting in a common mode level of differential output voltages may occur. Hence, a common mode feedback (CMFB) circuit is required to establish the common mode level.

Referring to FIG. 1, a conventional fully differential amplifier comprises a first amplifier stage 1, a second amplifier stage 2, and a CMFB circuit 3. The CMFB circuit 3 includes a common mode level detector 31 and an amplifier 32. Since the fully differential amplifier is a closed-loop system, it encounters stability problems. If frequency compensation is inadequately performed, oscillation of the amplifier will occur. There are the following two conventional types of common mode frequency compensation methods:

(1) Reduce Loop Gain

In a state where pole frequency is unchanging, the unity gain frequency may move down in frequency when the loop gain becomes small, such that a phase margin becomes large. In the conventional configuration, a pair of resistors (not shown) may be included in the amplifier 32 to reduce loop gain using source degeneration. Alternatively, a pair of current sources (not shown) may be included in the first amplifier stage 1 to reduce loop gain by minimizing a current ratio of a feedback current mirror. However, such methods may cause a reduction in bandwidth, an increase in offset voltage, and an increase in common mode noise.

(2) Increase Zero

In addition to the above methods, it is possible to include in the CMFB circuit 3 a zero generator (not shown) A phase lag of a pole is reduced using a phase lead generated by adding zeros, such that a phase margin is increased. However, this method is significantly influenced by process drift, and the zero generator requires large resistors and capacitors, such that zeros added thereby are in a low frequency range. Also, it is necessary to provide a large physical area for placement of the zero generator due to the use of such large resistors and capacitors.

SUMMARY OF THE INVENTION

Therefore, the object of this invention is to provide a fully differential amplifier having a high bandwidth, a low offset voltage, and low common mode noise, that is minimally affected by process drift, and that is small in size.

The fully differential amplifier of this invention comprises: an N-stage amplifier including first to Nth amplifier stages, where N is a positive integer greater than or equal to 2, the first to Nth amplifier stages being cascaded in sequence so as to generate a pair of differential output voltages; a common mode feedback circuit coupled to the N-stage amplifier, detecting a common mode level of the differential output voltages, and controlling the first amplifier stage according to the common mode level detected thereby; and a common mode frequency compensation circuit including a pair of capacitors, each having a first terminal coupled to the N-stage amplifier to receive a respective one of the differential output voltages, and a second terminal coupled to a common mode node of the first to (N-1)th amplifier stages of the N-stage amplifier.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

A fully differential amplifier according to the present invention comprises an N-stage amplifier including first to Nth amplifier stages, where N is a positive integer greater than or equal to 2. The first to Nth amplifier stages are cascaded in sequence so as to generate a pair of differential output voltages ($V_{OP}$, $V_{ON}$).

Figure 1:
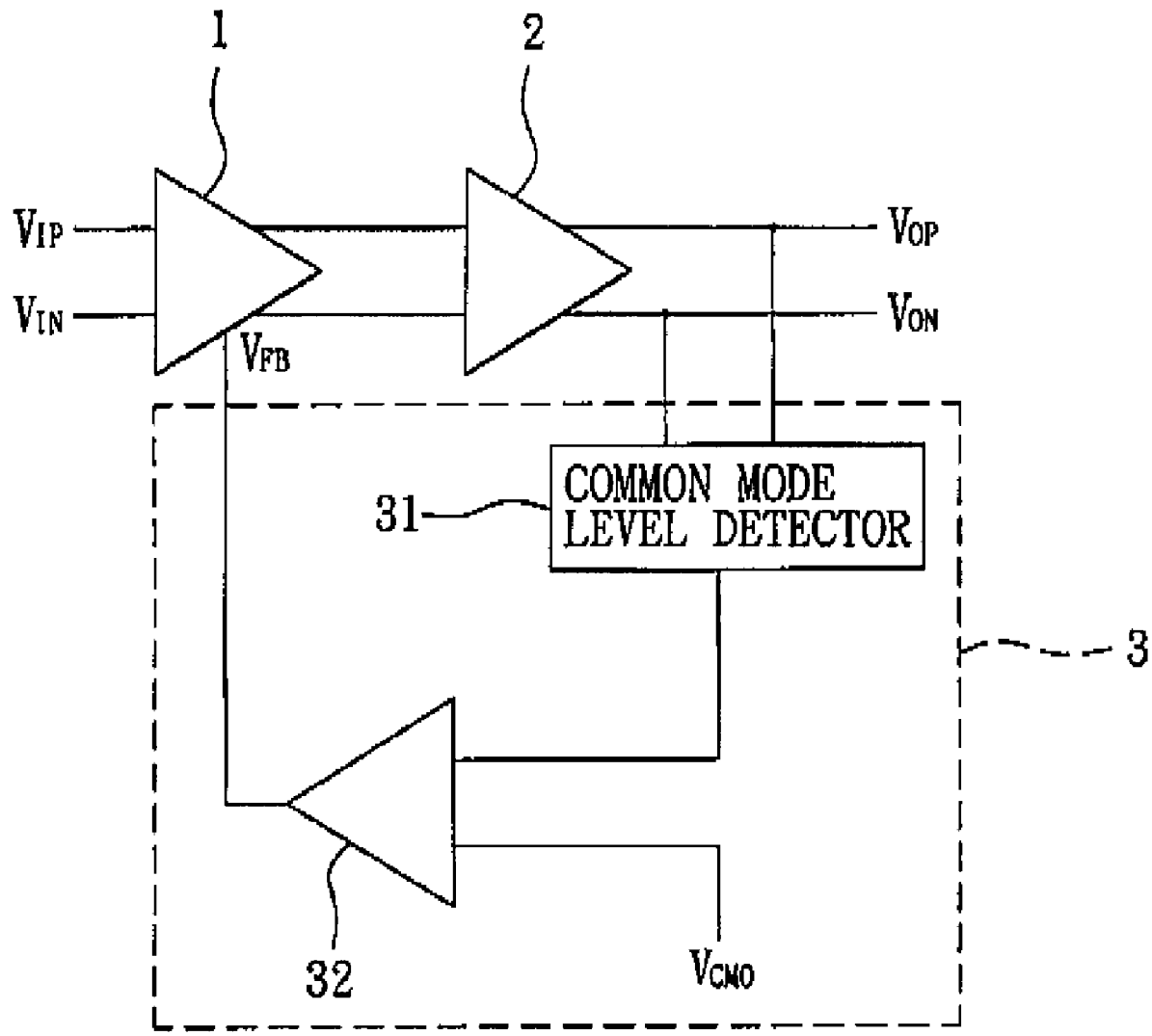
FIG. 1 is a schematic circuit symbol/block diagram of a conventional fully differential amplifier.
Figure 2:
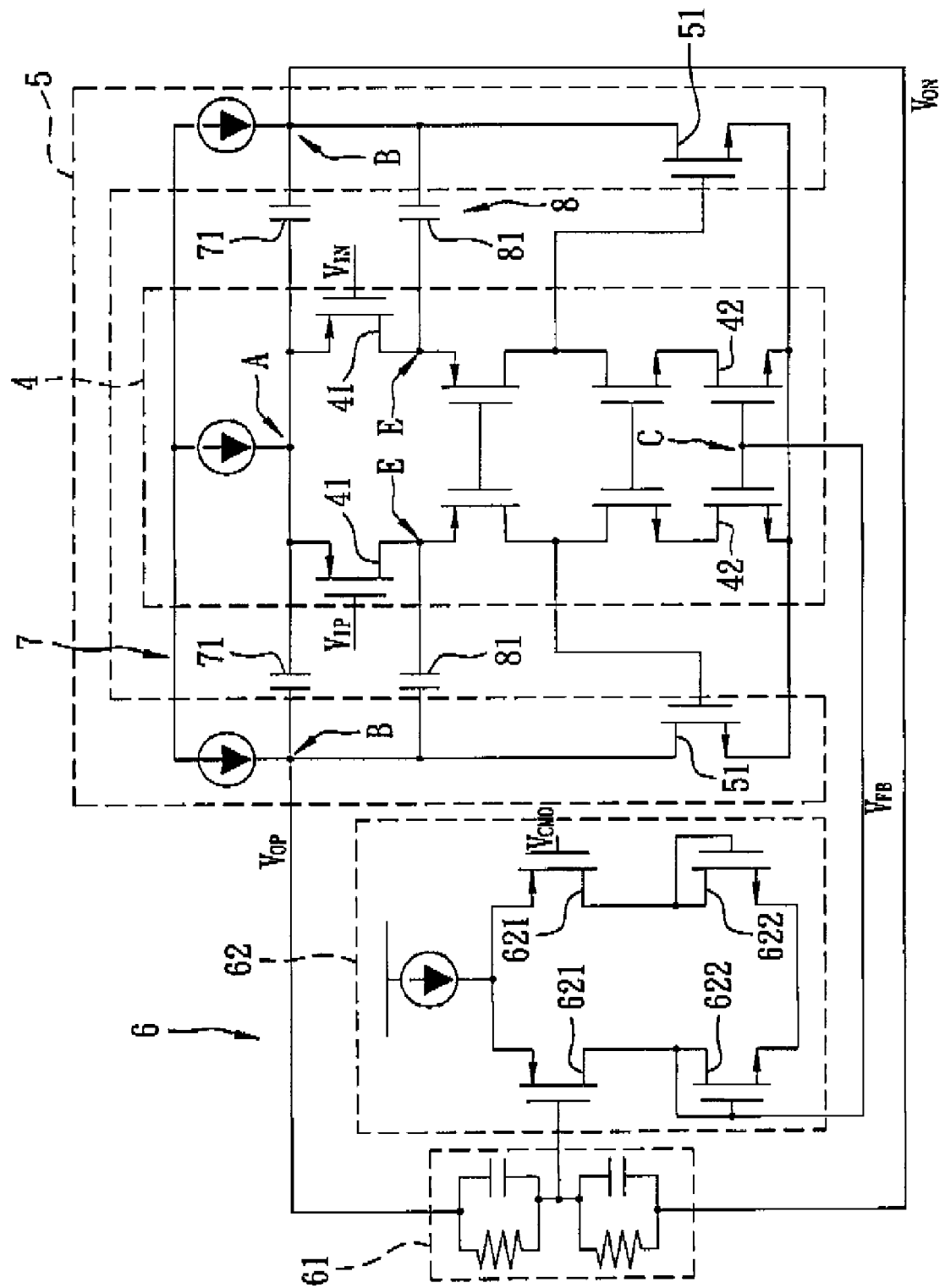
FIG. 2 is a component level diagram of a fully differential amplifier according to a preferred embodiment of the present invention.

Referring to FIG. 2, in the preferred embodiment, the fully differential amplifier comprises a first amplifier stage 4 and a second amplifier stage 5. The fully differential amplifier according to the preferred embodiment further comprises a common mode feedback circuit 6, a common mode frequency compensation circuit 7, and a differential mode frequency compensation circuit 8.

The first and second amplifier stages 4, 5 are cascaded in sequence, and sequentially amplify a pair of differential input voltages ($V_{IP}$, $V_{IN}$) so as to generate a pair of differential output voltages ($V_{OP}$, $V_{ON}$). The second amplifier 5 has a pair of output nodes (B) associated respectively with the output voltages ($V_{OP}$, $V_{ON}$).

The common mode feedback circuit 6 is coupled to the first and second amplifier stages 4, 5. The common mode feedback circuit 6 detects a common mode level of the differential output voltages ($V_{OP}$, $V_{ON}$), and controls the first amplifier stage 4 according to the common mode level detected thereby to ultimately adjust the common mode level.

In greater detail, the common mode feedback circuit 6 includes a common mode level detector 61 and an amplifier 62. The common mode level detector 61 is coupled to the output nodes (B) of the second amplifier stage 5, and detects the common mode level of the differential output voltages ($V_{OP}$, $V_{ON}$) through this connection. The amplifier 62 is coupled to the common mode level detector 61 and the first amplifier stage 4, and amplifies a difference between the common mode level and a reference voltage ($V_{CMO}$) to generate an amplified voltage ($V_{FB}$). The amplifier 62 performs feedback of the amplified voltage ($V_{FB}$) to the first amplifier stage 4 such that the common mode level is made substantially equal to the reference voltage ($V_{CMO}$).

The common mode frequency compensation circuit 7 performs compensation of a common mode frequency response. The common mode frequency compensation circuit 7 includes a pair of capacitors 71, each of which has a first terminal coupled to a respective one of the output nodes (B) of the second amplifier 5 to receive a respective one of the differential output voltages ($V_{OP}$, $V_{ON}$), and a second terminal coupled to a common mode node (A) of the first amplifier stage 4.

The differential mode frequency compensation circuit B performs compensation of a differential mode frequency response. The differential mode frequency compensation circuit 8 includes a pair of capacitors 81, each coupled between the first amplifier stage 4 and a respective one of the output nodes (B). That is, each of the capacitors 81 of the differential mode frequency compensation circuit 8 includes a first terminal coupled to a respective one of the output nodes (B), and a second terminal coupled to a respective differential mode node (E) of the first amplifier stage 4.

In the preferred embodiment, the differential mode loop has two amplifier stages, such that there are two poles with a unity gain frequency, a non-dominant pole frequency, and a phase margin as follows:

$$\omega_u = \frac{g_{m41}}{C_{g1}}, \omega_{p2} = \frac{g_{m51}}{C_B + C_{71}}, PM = 90 - \tan^{-1}\left(\frac{B \cdot \omega_u}{\omega_{p2}}\right),$$

where $\omega_n$ is a unity gain frequency, $\omega_{p2}$ is a non-dominant pole frequency, PM is a phase margin, $g_{m41}$ is a transconductance of each PMOS (p-channel metal-oxide-semiconductor field-effect transistor) 41 of the first amplifier stage 4, $C_{B1}$ is a capacitance of the capacitors 81, $g_{m51}$ is a transconductance of each NMOS (n-channel metal-oxide-semiconductor field-effect transistor) 51 of the second amplifier stage 5, $C_B$ is a capacitance prior to compensation seen from the output nodes (B) associated with the pair of the differential output voltages ($V_{OP}$, $V_{ON}$), $C_{71}$ is a capacitance of the capacitors 71, and $\beta$ is a feedback factor.

In the preferred embodiment, the common mode loop has three amplifier stages, such that there are three poles with a unity gain frequency, a non-dominant pole frequency, and a phase margin as follows:

$$\omega_{u\_c} = \frac{g_{m621}}{g_{m622}} \frac{g_{m42}}{C_{71} + C_{81}}, \omega_{p2\_c} = \frac{g_{m51}}{C_B}, \omega_{p3\_c} = \frac{g_{m622}}{C_C},$$

$$PM = 90 - \tan^{-1}\left(\frac{\omega_{u\_c}}{\omega_{p2\_c}}\right) - \tan^{-1}\left(\frac{\omega_{u\_c}}{\omega_{p3\_c}}\right),$$

where $\omega_{u\_c}$ is a unity gain frequency, $\omega_{p2\_c}$ and $\omega_{p3\_c}$ are non-dominant pole frequencies, PM is a phase margin, $g_{m621}$ is a transconductance of each PMOS 621 of the amplifier 62, $g_{m622}$ is a transconductance of each NMOS 622 of the amplifier 62, $g_{m42}$ is a transconductance of each NMOS 42 of the first amplifier stage 4, and $C_c$ is a capacitance seen at a feedback node (C) of the amplified voltage ($V_{FB}$).

Figure 3:
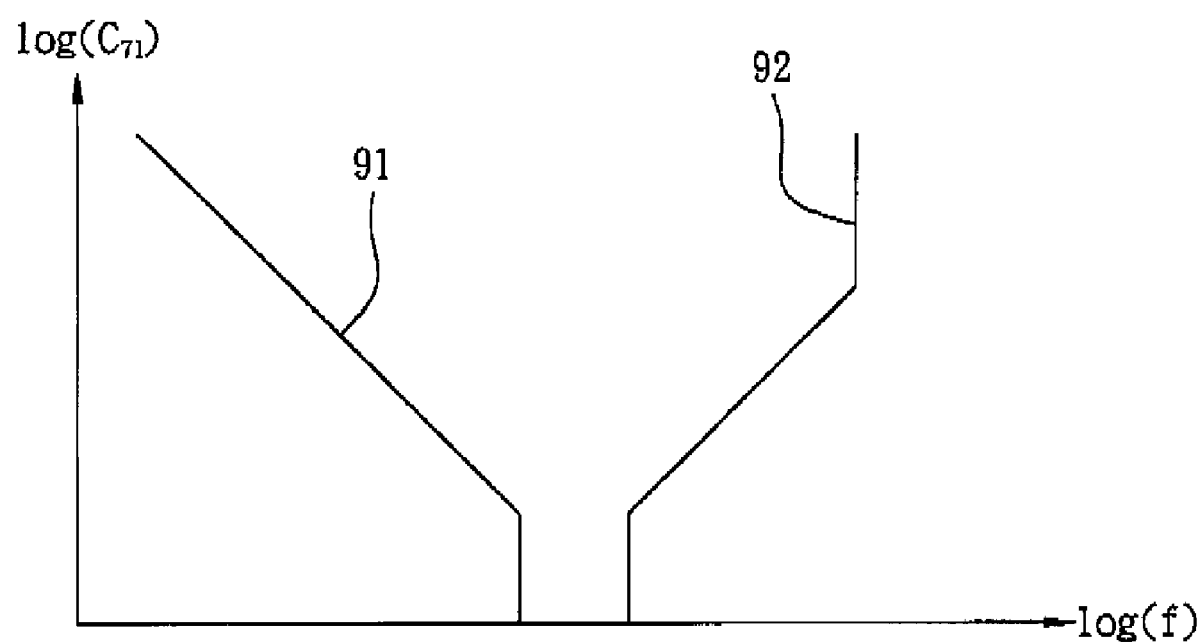
FIG. 3 is a plot of pole splitting characteristics associated with Miller compensation.

In the preferred embodiment, due to the Miller Effect, each of the capacitors 71 is able to generate an equivalent capacitance, the value of which is $(1-A_M)C_{71}$, where $A_M$ is a voltage gain from the common mode node (A) to the output nodes (B). When $A_M<-1$, $(1-A_M)C_{71}>2C_{71}$. Therefore, the common mode frequency compensation circuit 7 requires only small capacitors to achieve a common mode frequency compensation effect. Referring to FIG. 3, Miller compensation causes pole splitting. That is, when the capacitance $C_{71}$ of each of the capacitors 71 is increased, the dominant pole frequency $\omega_{p1\_c}$ moves down in frequency (as indicated by line 91 in FIG. 3), i.e., becomes more dominant, while the non-dominant pole frequency $\omega_{p2\_c}$ moves up in frequency (as indicated by line 92 in FIG. 3). Hence, the bandwidth increases.

Figure 4:
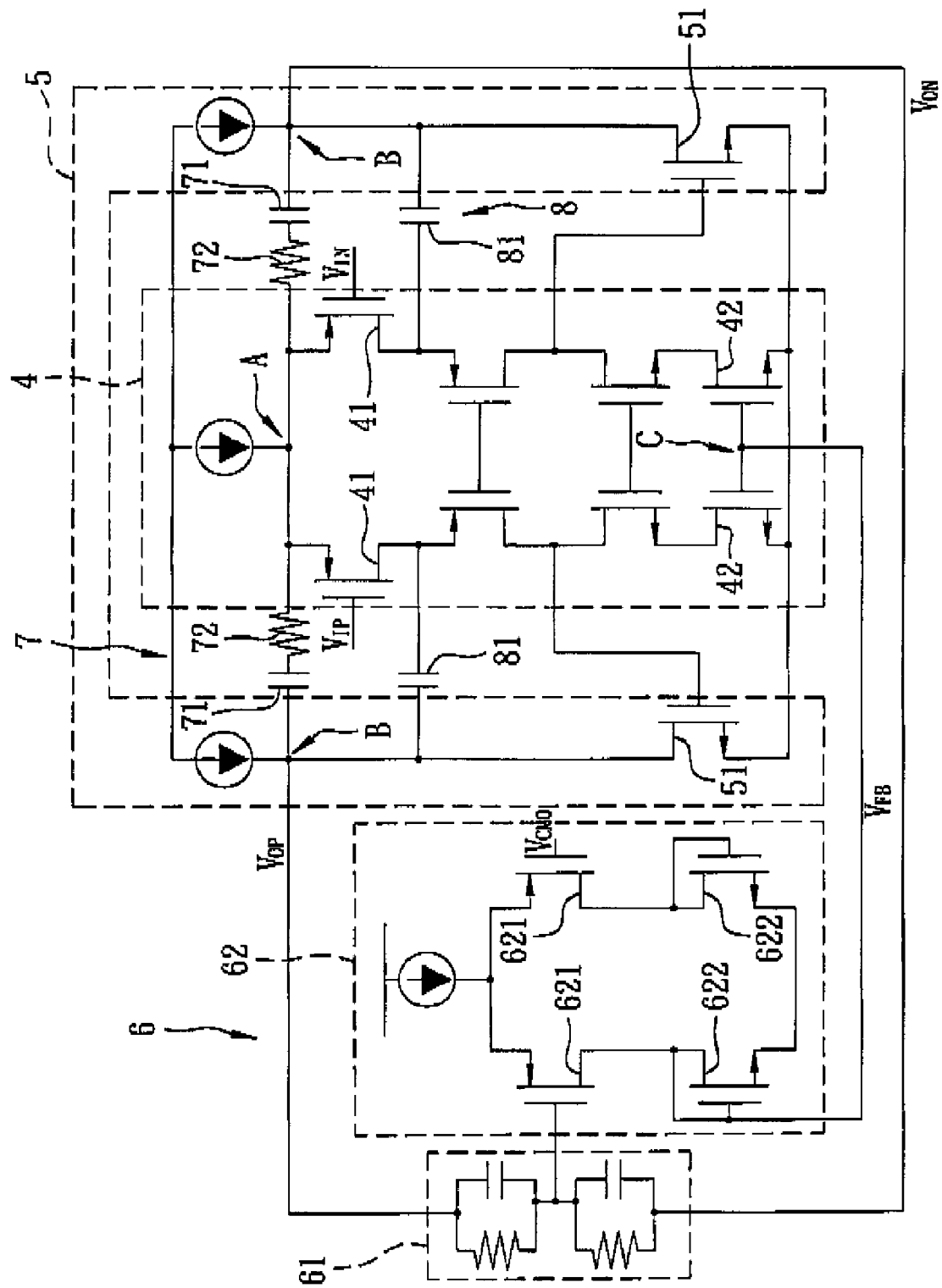
FIG. 4 is a component level diagram of a modified example of the preferred embodiment.

However, since the capacitive load of the common mode frequency compensation circuit 7 seen from the output nodes (B) may increase, the non-dominant pole $\omega_{p2}$ in the differential mode loop is unable to reach $g_{m51}/C_B$. Referring to FIG. 4, the common mode frequency compensation circuit 7 may further include a pair of resistors 72 disposed such that the second terminals of the capacitors 71 are coupled to the common mode node (A) of the first amplifier stage 4 respectively through the resistors 72. At this time, an impedance seen from the output nodes (B) associated with the pair of the differential output voltages ($V_{OP}$, $V_{ON}$) is as follows:

$$Z_B = \frac{R_B(1 + sR_{72}C_{71})}{sR_BC_{71} + (1 + sR_{72}C_{71})(1 + sR_BC_B)}$$

$$= \frac{R_B}{\frac{sR_BC_{71}}{(1 + sR_{72}C_{71})} + (1 + sR_BC_B)}$$

where $Z_B$ is an impedance seen from the output nodes (B), and $R_{72}$ is a resistance of the resistors 72. When $R_{72} >> R_B$, $R_B = 1/g_{m51}$ and $Z_L \cong R_B/(1+sR_BC_B)$ such that $\omega_{p2} \cong g_{m51}/C_B$. In the preferred embodiment, $R_{72}$ is set as 2 to 3 times $1/g_{m51}$. However, the present invention is not limited in this respect and other values for $R_{72}$ may be used.

Figure 5:
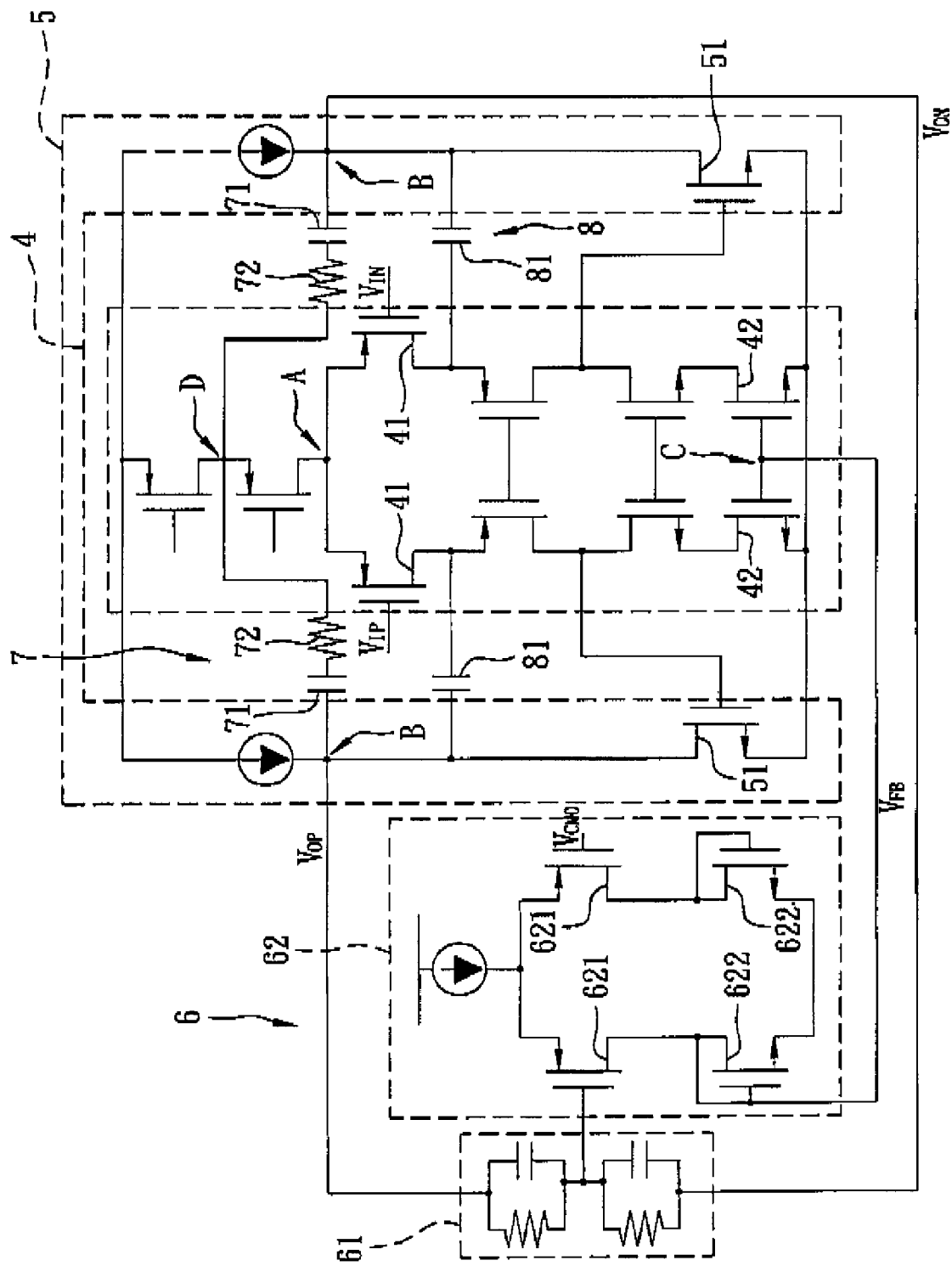
FIG. 5 is a component level diagram of another modified example of the preferred embodiment.

It is noted that one of the terminals of each of the capacitors 71 may be coupled to a different common mode node of the first amplifier stage 4 through a respective one of the resistors 72. For example, referring to FIG. 5, the second terminals of the capacitors 71 may be coupled to a common mode node (D) of the first amplifier stage 4 respectively through the resistors 72. The present invention is not limited in this respect and it is necessary only that a voltage gain from the common mode node (e.g., A or D) to the output nodes (B) of the second amplifier stage 5 from which the differential output voltages ($V_{OP}$, $V_{ON}$) are obtained be negative.

The present invention utilizes Miller compensation to perform compensation of the common mode frequency response. In a state where it is not possible to reduce the loop gain, the bandwidth is high, the offset voltage is low, the common mode noise is low, and there is minimal influence from process drift. Additionally, since it is possible to use small resistors and capacitors, the resulting size of the fully differential amplifier of the present invention may be minimized.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A fully differential amplifier, comprising:
   an N-stage amplifier including first to Nth amplifier stages, where N is a positive integer greater than or equal to 2, said first to Nth amplifier stages being cascaded in sequence so as to generate a pair of differential output voltages;

a common mode feedback circuit coupled to said N-stage amplifier, detecting a common mode level of the differential output voltages, and controlling said first amplifier stage according to the common mode level detected thereby; and a common mode frequency compensation circuit including a pair of capacitors, each having a first terminal coupled to said N-stage amplifier to receive a respective one of the differential output voltages, and a second terminal coupled to a common mode node of said first to (N-1)th amplifier stages of said N-stage amplifier.

2. The fully differential amplifier of claim 1, wherein a voltage gain from the common mode node to output nodes of said Nth amplifier stage from which the differential output voltages are obtained is negative.

3. The fully differential amplifier of claim 1, wherein said common mode frequency compensation circuit further includes a pair of resistors, said second terminals or said capacitors being coupled to the common mode node respectively through said resistors.

4. The fully differential amplifier of claim 3, wherein a resistance of each of said resistors is approximately two to three times a multiplicative inverse of a transconductance of said Nth amplifier stage.

5. The fully differential amplifier of claim 1, wherein said common mode feedback circuit includes:

a common mode level detector coupled to said N-stage amplifier and detecting the common mode level of the differential output voltages; and an amplifier coupled to said detector and said first amplifier stage and amplifying a difference between the common mode level and a reference voltage to generate an amplified voltage;

wherein said amplifier performs feedback of the amplified voltage to said first amplifier stage such that the common mode level is made substantially equal to the reference voltage.

6. The fully differential amplifier of claim 1, further comprising a differential mode frequency compensation circuit coupled to said N-stage amplifier for performing compensation of a differential mode frequency response.

7. A fully differential amplifier, comprising:

a first amplifier stage;

a second amplifier stage cascaded in sequence with said first amplifier stage so as to generate a pair of differential output voltages, said second amplifier stage having a pair of output nodes;

a common mode feedback circuit coupled to said first and second amplifier stages, detecting a common mode level of the differential output voltages, and controlling said first amplifier stage according to the common mode level detected thereby; and a common mode frequency compensation circuit including a pair of capacitors, each having a first terminal coupled to a respective one of the output nodes of said second amplifier stage to receive a respective one of the differential output voltages, and a second terminal coupled to a common mode node of said first amplifier stage.

8. The fully differential amplifier of claim 7, wherein a voltage gain from the common mode node to the output nodes of said second amplifier stage from which the differential output voltages are obtained is negative.

9. The fully differential amplifier of claim 7, wherein said common mode frequency compensation circuit further includes a pair of resistors, said second terminals of said capacitors being coupled to the common mode node respectively through said resistors.

10. The fully differential amplifier of claim 9, wherein a resistance of each of said resistors is approximately two to three times a multiplicative inverse of a transconductance of said second amplifier stage.

11. The fully differential amplifier of claim 7, wherein said common mode feedback circuit includes:

a common mode level detector coupled to the output nodes of said second amplifier stage and detecting the common mode level of the differential output voltages; and an amplifier coupled to said common mode level detector and said first amplifier stage, and amplifying a difference between the common mode level and a reference voltage to generate an amplified voltage;

wherein said amplifier performs feedback of the amplified voltage to said first amplifier stage such that the common mode level is made substantially equal to the reference voltage.

12. The fully differential amplifier of claim 7, further comprising a differential mode frequency compensation circuit coupled to said first amplifier stage and the output nodes of said second amplifier stage for performing compensation of a differential mode frequency response.

13. The fully differential amplifier of claim 12, wherein said differential mode frequency compensation circuit includes a pair of capacitors, each coupled between said first amplifier stage and a respective one of the output nodes.

* * * * *